United States Patent
Guo et al.

(10) Patent No.: US 11,296,714 B2
(45) Date of Patent: Apr. 5, 2022

(54) RESIDUE TRANSFER LOOP, SUCCESSIVE APPROXIMATION REGISTER ANALOG-TO-DIGITAL CONVERTER, AND GAIN CALIBRATION METHOD

(71) Applicant: Radiawave Technologies Co., Ltd., Shenzhen (CN)

(72) Inventors: Xiaofeng Guo, Shenzhen (CN); Erkan Alpman, Portland, OR (US); Jon Sweat Duster, Beaverton, OR (US); Haigang Feng, Shenzhen (CN); Ning Zhang, Shenzhen (CN); Yulin Tan, Shenzhen (CN)

(73) Assignee: Radiawave Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/318,143

(22) Filed: May 12, 2021

(65) Prior Publication Data
US 2021/0266004 A1 Aug. 26, 2021

Related U.S. Application Data

(63) Continuation of application No. PCT/CN2019/113092, filed on Oct. 24, 2019.

(30) Foreign Application Priority Data

Nov. 16, 2018 (CN) .......................... 201811372962.4

(51) Int. Cl.
*H03M 1/06* (2006.01)
*H03M 1/10* (2006.01)
*H03M 1/12* (2006.01)

(52) U.S. Cl.
CPC ............ *H03M 1/1014* (2013.01); *H03M 1/06* (2013.01); *H03M 1/1038* (2013.01); *H03M 1/1245* (2013.01)

(58) Field of Classification Search
CPC .... H03M 1/1245; H03M 3/422; H03M 3/464; H03M 1/804; H03M 3/426; H03M 1/002;
(Continued)

(56) References Cited

U.S. PATENT DOCUMENTS 7,468,688 B2 12/2008 Hesener
8,040,271 B2 * 10/2011 Furuta ................. H03M 1/0682
341/172
(Continued)

FOREIGN PATENT DOCUMENTS

CN 103368575 A 10/2013
CN 104092466 A 10/2014
(Continued)

OTHER PUBLICATIONS

First Office Action issued in counterpart Chinese Patent Application No. 201811372962.4, dated May 14, 2020.
(Continued)

*Primary Examiner* — Linh V Nguyen
(74) *Attorney, Agent, or Firm* — Westbridge IP LLC

(57) ABSTRACT

A residue transfer loop, a successive approximation register analog-to-digital converter and a gain calibration method are disclosed. In particular, the residue transfer loop includes a sampling switch module, a logic controlling circuit, a residue holding capacitor module, a DAC capacitor array, a residue transfer module, a current rudder, a reset switch module and a charge sharing switch module. The logic controlling circuit sequentially outputs control signals according to preset time intervals in a preset period to control the reset switch module, the residue transfer module, the sampling switch module and the charge sharing switch module to work sequentially, thereby realizing a residue transfer.

17 Claims, 5 Drawing Sheets

(58) Field of Classification Search
CPC .... H03M 1/466; H03M 1/468; H03M 1/1009;
H03M 1/1038; H03M 1/38; H03M 1/164;
H03M 3/37; H03M 1/44; H03M 3/444;
H03M 1/1071; H03M 1/46; H03M 1/74;
H03M 3/378; H03M 3/434; H03M 3/452;
H03M 3/454; H03M 3/498; H03M 1/001;
H03M 1/06; H03M 1/0668; H03M
1/1019; H03M 1/12; H03M 3/49; H03M
3/458
USPC .................... 341/118–121, 150, 155, 172
See application file for complete search history.

(56) References Cited

U.S. PATENT DOCUMENTS

| | | | |
|---|---|---|---|
| 8,922,418 B2 | 12/2014 | Elsayed et al. | |
| 9,106,246 B2* | 8/2015 | Yang | H03M 1/403 |
| 9,531,400 B1* | 12/2016 | Wen | H03M 1/1009 |
| 10,862,497 B1* | 12/2020 | Lin | H03M 1/1245 |
| 11,050,431 B1* | 6/2021 | Ma | H03M 1/0697 |
| 2010/0090873 A1* | 4/2010 | Yang | H03M 1/1061 |
| | | | 341/126 |
| 2011/0234433 A1* | 9/2011 | Aruga | H03M 1/06 |
| | | | 341/172 |
| 2013/0088375 A1* | 4/2013 | Wu | H03M 1/1047 |
| | | | 341/120 |
| 2016/0359463 A1* | 12/2016 | Kurose | H03M 1/50 |
| 2018/0219558 A1* | 8/2018 | Chiu | H03M 1/804 |

FOREIGN PATENT DOCUMENTS

| | | |
|---|---|---|
| CN | 104168025 A | 11/2014 |
| CN | 104469201 A | 3/2015 |
| CN | 204376879 U | 6/2015 |
| CN | 104868917 A | 8/2015 |
| CN | 106941355 A | 7/2017 |
| CN | 107565969 A | 1/2018 |
| CN | 108809310 A | 11/2018 |
| CN | 109217874 A | 1/2019 |
| EP | 3090488 A1 | 11/2016 |

OTHER PUBLICATIONS

He et al., A 14-bit Successive-Approximation AD Converter with Digital Calibration Algorithm, 2009 IEEE 8th International Conference on ASIC, Dec. 11, 2009, pp. 234-237.
International Search Report and Written Opinion in corresponding PCT Application No. PCT/CN2019/113092, dated Jan. 8, 2020.
Li, Study on Successive Approximation-Pipeline Hybrid ADC Based on Zero-Crossing Detector, China Excellent Master's Thesis Full-text Database Information Technology Series, Mar. 15, 2017, pp. 15-59, China.
Wu et al., An 80Mps 10-bit 2b/step Successive Approximation Register ADC, The 24th Annual Meeting of the Circuit and System Society of the Chinese Institute of Electronics, Sep. 30, 2016, pp. 169-195, China.

* cited by examiner

RESIDUE TRANSFER LOOP, SUCCESSIVE APPROXIMATION REGISTER ANALOG-TO-DIGITAL CONVERTER, AND GAIN CALIBRATION METHOD

CROSS REFERENCES TO RELATED APPLICATIONS

The present application is a continuation application of International Application No. PCT/CN2019/113092, filed on Oct. 24, 2019, which claims priority to Chinese Patent Application No. 201811372962.4, filed on Nov. 16, 2018 and entitled "RESIDUE TRANSFER LOOP, SUCCESSIVE APPROXIMATION REGISTER ANALOG-TO-DIGITAL CONVERTER, AND GAIN CALIBRATION METHOD". The disclosures of the aforementioned applications are hereby incorporated by reference in their entireties.

TECHNICAL FIELD

The application relates to the technical field of semiconductor integrated circuits, in particular to a residue transfer loop, a successive approximation register analog-to-digital converter and a gain calibration method.

BACKGROUND

The statements here provide only background information relevant to the application and do not necessarily constitute prior art.

Sigma-delta noise shaping successive approximation register analog-to-digital converter (SAR ADC) is the latest popular high-precision ADC structure. Its ideological basis is to transfer the residue of SAR ADC to the next conversion, so as to improve the accuracy of SARADC to a higher level. At the same time, it retains the characteristics of simple structure, low power consumption, small area, high process fitness, stable performance of SAR ADC. Generally, for a 12-bit resolution SAR ADC, the remaining amount is already lower than 1 mV. It is the key and difficult point of SAR ADC to transfer the remaining amount of about 1 mV to achieve ultra-high precision. Therefore, it is very necessary to design a suitable residue transfer method.

SUMMARY

The main purpose of the present application is to provide a residue transfer loop aimed at achieving ultra-high precision residue transfer for SAR ADC.

To realize the purpose above, the present invention provides a residue transfer loop including a sampling switch module, a logic controlling circuit, a residue holding capacitor module, a digital-to-analog converter (DAC) capacitor array, a residue transfer module, a current rudder, a reset switch module and a charge sharing switch module; the DAC capacitor array includes a first DAC capacitor array and a second DAC capacitor array constituting a differential structure;

a first terminal of the sampling switch module is configured to input differential analog signals, a second terminal of the sampling switch module is connected with a first terminal of the DAC capacitor array, a second terminal of the DAC capacitor array, a first terminal of the charge sharing switch module, a first controlled terminal of the residue transfer module and an input terminal of a comparator are connected, an input terminal of the residue transfer module is connected with a power output terminal of the current rudder, an output terminal of the residue transfer module is connected with a first terminal of the residue holding capacitor module, a second terminal of the charge sharing switch module and a first terminal of the reset switch module, a second terminal of the residue holding capacitor module and a second terminal of the reset switch module are grounded, and a controlled terminal of the sampling switch module, a second controlled terminal of the residue transfer module, a controlled terminal of the charge sharing switch module and a controlled terminal of the reset switch module are all connected with a controlling terminal of a logic controlling circuit;

the current rudder is configured to output a static working current;

the logic controlling circuit is configured to sequentially output control signals according to a preset time interval in a preset period to control the reset switch module, the residue transfer module, the sampling switch module and the charge sharing switch module to work sequentially;

the reset switch module is configured to reset a charge of the residue holding capacitor module based on a control of the logic controlling circuit;

the sampling switch module is configured to start under control of the logic controlling circuit, input differential analog signals from external to the DAC capacitor array, so that the differential analog signals are sampled by the DAC capacitor array and a differential residue signal is output;

the residue transfer module is configured to output a static working current from the current rudder to the residue holding capacitor module for charging based on the control of the differential residue signal and the logic controlling circuit after receiving the differential residue signal from the DAC capacitor array; and the charge sharing switch module is configured to share charges between the residue holding capacitor module and the DAC capacitor array under control of the logic controlling circuit after the DAC capacitor array finishes sampling, and generates the same differential residue signals for a next residue transfer.

Optionally, the residue transfer module includes a first P-channel metal-oxide-semiconductor (PMOS) transistor, a second PMOS transistor, and a first switch circuit;

an input terminal of the first switch circuit is the input terminal of the residue transfer module, the controlled terminal of the first switch circuit is the second controlled terminal of the residue transfer module, an output terminal of the first switch circuit, a source electrode of the first PMOS transistor and a source electrode of the second PMOS transistor are interconnected, a drain electrode of the first PMOS transistor and a drain electrode of the second PMOS transistor are the output terminals of the residue transfer module, and a gate electrode of the first PMOS transistor and a gate electrode of the second PMOS transistor are the output terminals of the residue transfer module.

Optionally, the residue holding capacitor module includes a first residue holding capacitor and a second residue holding capacitor with a same capacitance, the first terminal of the first residue holding capacitor is connected to the drain electrode of the first PMOS transistor, a first terminal of the second residue holding capacitor is connected to the drain electrode of the second PMOS transistor, and a second terminal of the first residue holding capacitor and the second residue holding capacitor are both grounded.

Optionally, the logic controlling circuit includes a SAR logic controller and a clock generator;

a controlling terminal of the SAR logic controller is respectively connected with the controlled terminal of the sampling switch module, the second controlled terminal of the residue transfer module, the controlled terminal of the charge sharing switch module and the controlled terminal of the reset switch module, and a signal terminal of the clock generator is connected with a signal terminal of the SAR logic controller;

the clock generator is configured to output a fixed width pulse signal to the SAR logic controller, so that the residue transfer module is controlled by the SAR logic controller to charge the residue holding capacitor at a first preset time; and the SAR logic controller is configured to output a control signal to control the sampling switch module, the residue transfer module, the charge sharing switch module and the reset switch module to work.

Optionally, a first terminal of the first DAC capacitor array is connected to a positive input terminal of the differential analog signal through a switch unit corresponding to the sampling switch module, and a second terminal of the first DAC capacitor array is a positive output terminal of the differential residue signal of the DAC capacitor array;

the first terminal of the second DAC capacitor array is connected with a negative input terminal of the differential analog signal through a switch unit corresponding to the sampling switch module, and the second terminal of the second DAC capacitor array is a negative output terminal of the differential residue signal of the DAC capacitor array.

Optionally, the first DAC capacitor array has a capacitance four times capacitance value of the first residue holding capacitor and the second DAC capacitor array has a capacitance four times capacitance value of the second residue holding capacitor.

Optionally, the first DAC capacitor array has a capacitance four times capacitance value of the first residue holding capacitor and the second DAC capacitor array has a capacitance four times capacitance value of the second residue holding capacitor.

Optionally, the first residue holding capacitor has a capacitance that is 32 times an equivalent capacitance of a lowest bit of the first DAC capacitor array;

a capacitance of the second residue holding capacitor is 32 times an equivalent capacitance of a lowest bit of the second DAC capacitor array.

Optionally, the current rudder is further connected to a digital controller configured to control the current rudder to output a varying static operating current to maintain a constant gain of the residue transfer module.

The present application further provides a successive approximation register analog-to-digital converter including a comparator, a register connected to an output terminal of the comparator and a residue transfer loop, where the residue transfer loop includes a sampling switch module, a logic controlling circuit, a residue holding capacitor module, a DAC capacitor array, a residue transfer module, a current rudder, a reset switch module and a charge sharing switch module; the DAC capacitor array includes a first DAC capacitor array and a second DAC capacitor array constituting a differential structure;

a first terminal of the sampling switch module inputs a differential analog signal, a second terminal of the sampling switch module is connected with a first terminal of the DAC capacitor array, a second terminal of the DAC capacitor array, a first terminal of the charge sharing switch module, a first controlled terminal of the residue transfer module and an input terminal of the comparator are connected, an input terminal of the residue transfer module is connected with a power output terminal of the current rudder, an output terminal of the residue transfer module is interconnected with a first terminal of the residue holding capacitor module, a second terminal of the charge sharing switch module and a first terminal of the reset switch module, the second terminal of the residue holding capacitor module and a second terminal of the reset switch module are both grounded, and a controlled terminal of the sampling switch module, a second controlled terminal of the residue transfer module, a controlled terminal of the charge sharing switch module and a controlled terminal of the reset switch module are all connected with the controlling terminal of the logic controlling circuit;

the current rudder is configured to output a static working current;

the logic controlling circuit is configured to sequentially output control signals according to a preset time interval in a preset period to control the reset switch module, the residue transfer module, the sampling switch module and the charge sharing switch module to work sequentially;

the reset switch module is configured to reset charge of the residue holding capacitor module under control of the logic controlling circuit;

the sampling switch module is configured to start under control of the logic controlling circuit, input differential analog signals from external to the DAC capacitor array, so that the differential analog signals are sampled by the DAC capacitor array and a differential residue signal is output;

the residue transfer module is configured to output a static working current from the current rudder to the residue holding capacitor module for charging based on the control of the differential residue signal and the logic controlling circuit in determination that receiving the differential residue signal from the DAC capacitor array; and the charge sharing switch module is configured to share charges between the residue holding capacitor module and the DAC capacitor array under control of the logic controlling circuit after the DAC capacitor array finishes sampling, and generates the same differential residue signals for a next residue transfer.

Optionally, the residue transfer module includes a first PMOS transistor, a second PMOS transistor, and a first switch circuit;

an input terminal of the first switch circuit is an input terminal of the residue transfer module, a controlled terminal of the first switch circuit is a second controlled terminal of the residue transfer module, an output terminal of the first switch circuit, a source electrode of the first PMOS transistor and a source electrode of the second PMOS transistor are interconnected, a drain electrode of the first PMOS transistor and a drain electrode of the second PMOS transistor are output terminals of the residue transfer module, and a gate electrode of the first PMOS transistor and a gate electrode of the second PMOS transistor are output terminals of the residue transfer module.

Optionally, the residue holding capacitor module includes a first residue holding capacitor and a second residue holding capacitor having a same capacitance, a first terminal of the first residue holding capacitor is connected to a drain electrode of the first PMOS transistor, a first terminal of the second residue holding capacitor is connected to a drain electrode of the second PMOS transistor, and a second terminal of the first residue holding capacitor and the second residue holding capacitor are both grounded.

Optionally, the logic controlling circuit includes a SAR logic controller and a clock generator;

a controlling terminal of the SAR logic controller is respectively connected with the controlled terminal of the sampling switch module, a second controlled terminal of the residue transfer module, a controlled terminal of the charge sharing switch module and a controlled terminal of the reset switch module, and a signal terminal of the clock generator is connected with the signal terminal of the SAR logic controller;

the clock generator is configured to output a fixed width pulse signal to the SAR logic controller, so that the residue transfer module is controlled by the SAR logic controller to charge the residue holding capacitor at a first preset time; and the SAR logic controller is configured to output a control signal to control the sampling switch module, the residue transfer module, the charge sharing switch module and the reset switch module to work.

Optionally, a first terminal of the first DAC capacitor array is connected to a positive input terminal of the differential analog signal through a switching unit corresponding to the sampling switch module, and a second terminal of the first DAC capacitor array is a positive output terminal of the differential residue signal of the DAC capacitor array;

the first terminal of the second DAC capacitor array is connected with a negative input terminal of the differential analog signal through a switch unit corresponding to the sampling switch module, and a second terminal of the second DAC capacitor array is a negative output terminal of the differential residue signal of the DAC capacitor array.

Optionally, the first DAC capacitor array has a capacitance four times larger than a capacitance value of the first residue holding capacitor and the second DAC capacitor array has a capacitance four times larger than a capacitance value of the second residue holding capacitor.

Optionally, the first residue holding capacitor has a capacitance that is 32 times an equivalent capacitance of the lowest bit of the first DAC capacitor array;

the capacitance of the second residue holding capacitor is 32 times an equivalent capacitance of the lowest bit of the second DAC capacitor array.

Optionally, the current rudder is further connected to a digital controller configured to control the current rudder to output a varying quiescent operating current to maintain a constant gain of the residue transfer module.

The present application further provides a gain calibration method arranged to perform gain calibration on a residue transfer loop, where the gain calibration method includes:

connecting a first terminal of the DAC capacitor array of the residue transfer loop with a reference voltage, a second terminal of the DAC capacitor array with a second power supply, and setting a differential analog signal from external to zero;

controlling the second power supply to output power to the second terminal of the DAC capacitor array to reset the second terminal of the DAC capacitor array to a common mode level and cause the DAC capacitor array to generate a differential residue signal;

controlling the DAC capacitor array to transfer the generated differential residue signal to the residue holding capacitor module via the residue transfer module;

sharing numerical charges after the residue transfer to the DAC capacitor array;

controlling the DAC capacitor array to perform analog-to-digital conversion on the numerical charges after the residue transfer and match with a preset binary code, and correspondingly control an output current of the current rudder 30 according to the matching result until a binary code after the analog-to-digital conversion of the DAC capacitor array is matched with the preset binary code.

The technical scheme of the application adopts a sampling switch module, a logic controlling circuit, a residue holding capacitor module, a DAC capacitor array, a residue transfer module, a current rudder, a reset switch module and a charge sharing switch module to form a residue transfer loop. The DAC capacitor array includes a first DAC capacitor array and a second DAC capacitor array constituting a differential structure. The current rudder is set to output static working current. A logic controlling circuit is set to sequentially output control signals according to preset time intervals in a preset period, in order to control the reset switch module, the residue transfer module, the sampling switch module and the charge sharing switch module to work in sequence. The reset switch module is based on the control of the logic controlling circuit. The charge of the residue holding capacitor module is reset, The sampling switch module is activated based on the control of the logic controlling circuit, inputting externally input differential analog signals into the DAC capacitor array, so that the array of DAC capacitors samples the external input differential analog signal, and outputs a differential residue signal. A residue transfer module is set such that upon receiving a differential residue signal from the DAC capacitor array, based on the differential residue signal and the control of the logic controlling circuit. The static working current from the current rudder is output to the residue holding capacitor module for charging. A charge sharing switch module, based on the control of logic controlling circuit, after the sampling of the DAC capacitor array is finished, the charge of the residue holding capacitor module and the DAC capacitor array is shared, and a new differential residue signal is generated for a next residue transfer. Each transferred differential residue signal is the same and accumulated to a next conversion, thus realizing first-order noise shaping and higher conversion accuracy.

BRIEF DESCRIPTION OF THE DRAWINGS

In order to explain more clearly the embodiments of the present application or the technical solutions in the related art, the drawings used in the description of the embodiments or the related art will be briefly introduced below. Obviously, the drawings in the following description are merely some embodiments of the present application. For those of ordinary skill in the art, other drawings can be obtained based on the structure shown in these drawings without creative work.

The realization of purposes, functional features and advantages of the present application will be further explained with reference to the accompanying drawings in connection with the embodiments.

DETAILED DESCRIPTION OF THE EMBODIMENTS

The technical aspects of the embodiments of the present application will be described clearly and completely in conjunction with the accompanying drawings of the embodiments of the present application. It is obvious that the described embodiments are only some of the embodiments of the present application, and not all of the embodiments. Based on the embodiments in the present application, all other embodiments obtained by those of ordinary skills in the art without creative labor fall within the claimed scope of the present application.

It should be noted that the descriptions of "first", "second" and the like in the present application are set for descriptive purposes only, and cannot be understood as indicating or implying the relative importance or implying the number of indicated technical features. Thus, a feature defined as "first" and "second" may explicitly or implicitly include at least one such feature. In addition, "and/or" appearing throughout the text has the meaning of: including three parallel solutions, taking "A/B" as an example, including solution A, or solution B, or solutions A and B both satisfied. In addition, the technical solutions between various embodiments can be combined with each other, but it must be based on the realization of those skilled in the art. When the combination of technical solutions contradicts or cannot be realized, it should be considered that such combination of technical solutions does not exist and is not within the scope of protection claimed by the present application.

The present application proposes a residue transfer loop.

Figure 1:
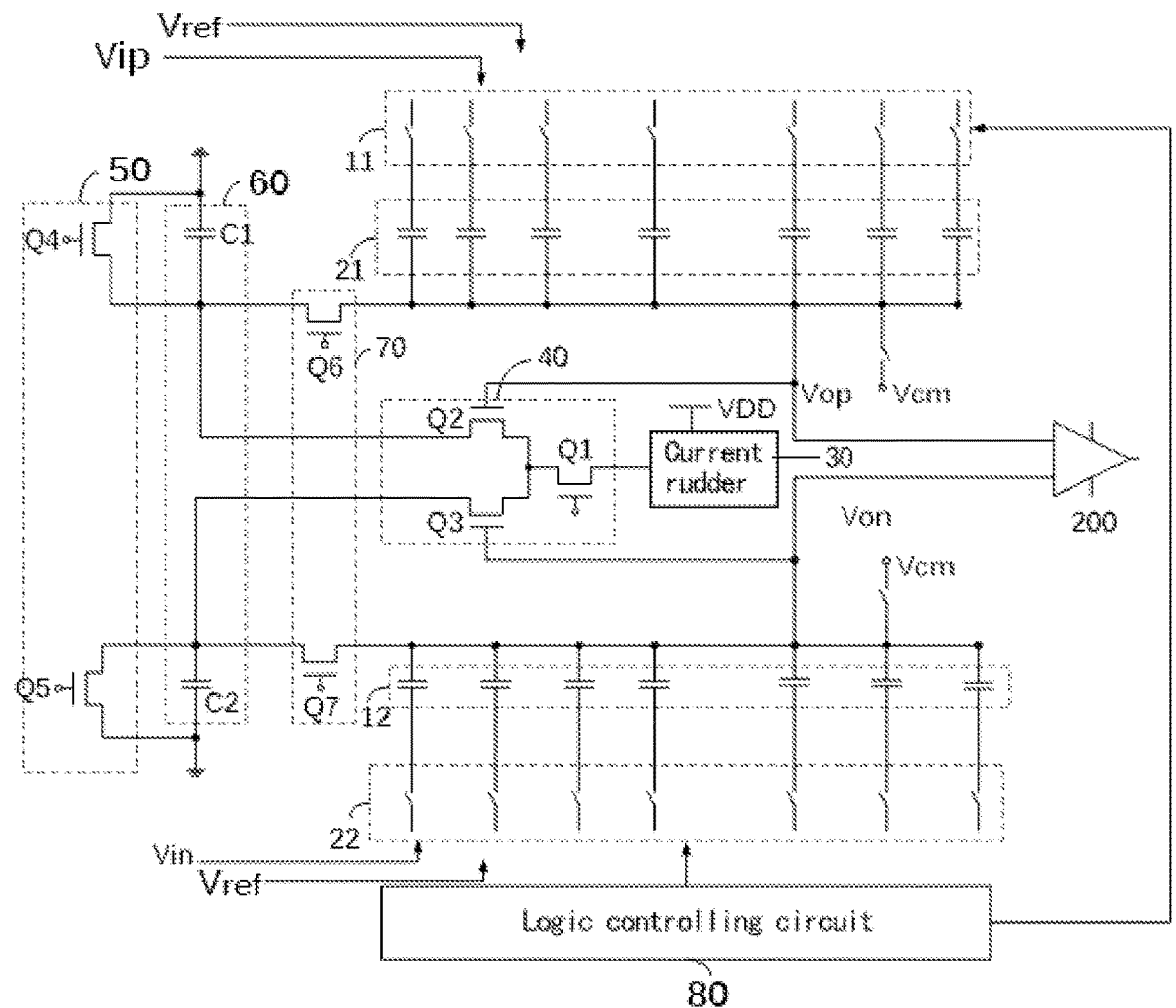
FIG. 1 is a schematic circuit diagram of an embodiment of a residue transfer loop of the present application.
Figure 2:
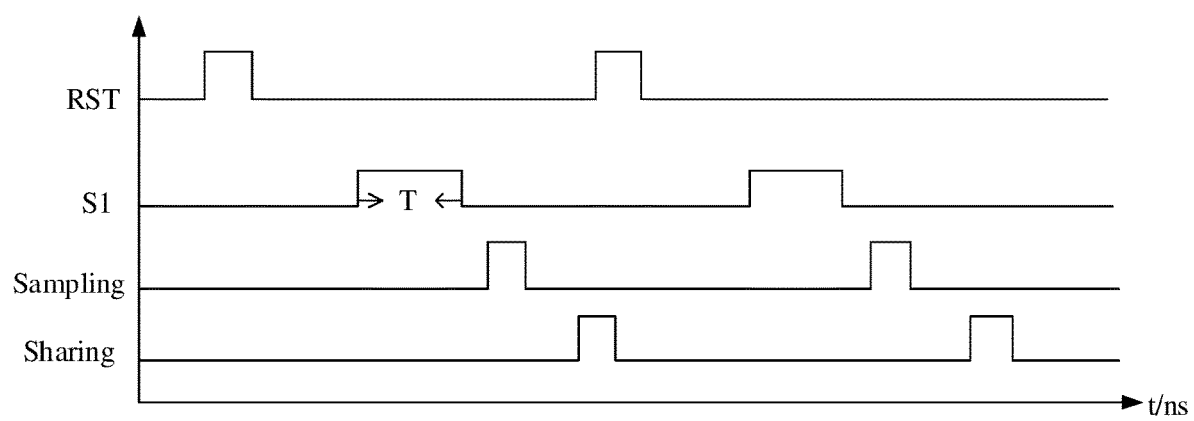
FIG. 2 is a schematic diagram of an operation timing of the residue transfer loop of the present application.
Figure 3:
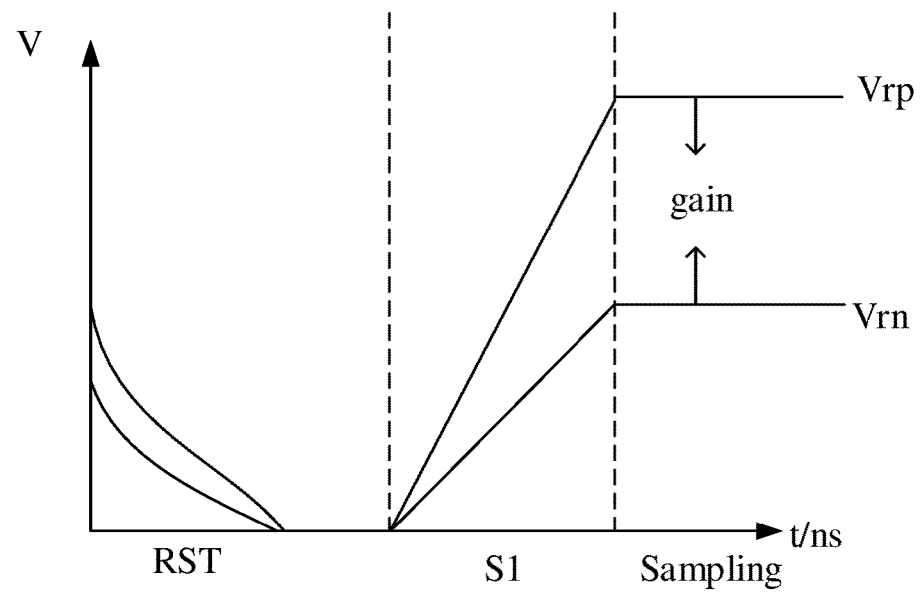
FIG. 3 is a schematic diagram of a voltage variation of the residue transfer loop of the present application.
Figure 4:
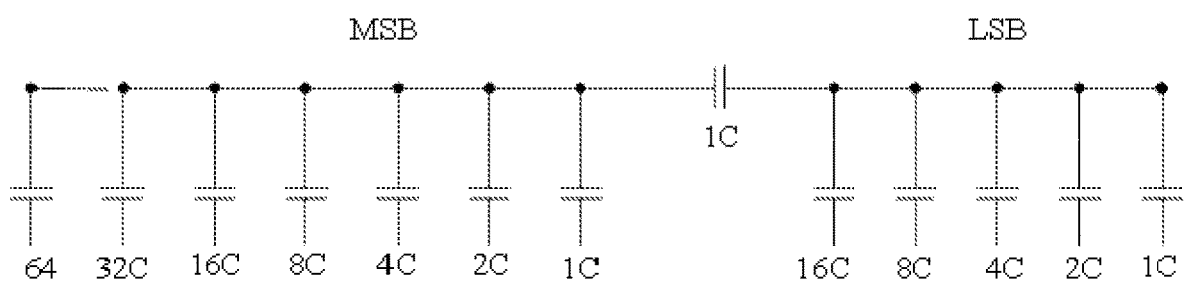
FIG. 4 is a schematic diagram of a structure of a DAC capacitor array in the residue transfer loop of the present application.

As shown in FIGS. 1 to 4, FIG. 1 is a schematic circuit diagram of an embodiment of a residue transfer loop, FIG. 2 is a schematic diagram of an operation timing sequence of the residue transfer loop of the present application, FIG. 3 is a schematic diagram of voltage variation of the residue transfer loop of the present application, and FIG. 4 is a schematic diagram of a structure of a DAC capacitor array in the residue transfer loop of the present application. In this embodiment, the residue transfer loop includes a sampling switch module, a logic controlling circuit 80, a residue holding capacitor module 60, a DAC capacitor array, a residue transfer module 40, a current rudder 30, a reset switch module 50, and a charge sharing switch module 70. The DAC capacitor array includes a first DAC capacitor array 21 and a second DAC capacitor array 22 constituting a differential structure.

Differential analog signals Vip and Vin are input by a first terminal of the sampling switch module, a second terminal of the sampling switch module is connected with a first terminal of the DAC capacitor array, a second terminal of the DAC capacitor array, a first terminal of the charge sharing switch module 70, first controlled terminals of the residue transfer module 40 and input terminals of the comparator 200 are interconnected correspondingly. An input terminal of the residue transfer module 40 is connected with a power output terminal of the current rudder 30, an output terminal of the residue transfer module 40 is interconnected with a first terminal of the residue holding capacitor module 60, a second terminal of the charge sharing switch module 70 and a first terminal of the reset switch module 50. A second terminal of the residue holding capacitor module 60 and a second terminal of the reset switch module 50 are grounded, and a controlled terminal of the sampling switch module, a second controlled terminal of the residue transfer module 40, a controlled terminal of the charge sharing switch module 70 and a controlled terminal of the reset switch module 50 are all connected with a controlling terminal of the logic controlling circuit 80.

The current rudder 30 is configured to output a static working current.

The logic controlling circuit 80 is configured to sequentially output control signals according to a preset time interval within a preset period to control the reset switch module 50, the residue transfer module 40, the sampling switch module and the charge sharing switch module 70 to work sequentially.

The reset switch module 50 is configured to reset charges of the residue holding capacitor module 60 under control of the logic controlling circuit 80.

The sampling switch module is configured to start under control of the logic controlling circuit 80, input differential analog signals from external to the DAC capacitor array, so that the differential analog signals are sampled by the DAC capacitor array and a differential residue signal is output.

The residue transfer module 40 is configured to output the static working current from the current rudder 30 to the residue holding capacitor module 60 for charging based on the differential residue signal and the control of the logic controlling circuit 80 after receiving the differential residue signal from the DAC capacitor array.

The charge sharing switch module 70 is configured to share charges between the residue holding capacitor module 60 and the DAC capacitor array under control of the logic controlling circuit 80 after the DAC capacitor array finishes sampling, and generates the same differential residue signal for a next residue transfer.

In this embodiment, the residue transfer loop is suitable for a first-order noise shaping successive approximation register analog-to-digital converter with arbitrary bit width. Accuracy of the residue transfer loop determines conversion accuracy of the analog-to-digital converter. The concept of residue transfer is to transfer and accumulate a generated error ($\partial q$=Dout−Din, for SAR ADC, a residue is an error) to a next sampling input after an end of each conversion, thereby realizing the function of the first-order sigma-delta modulator on the basis of SAR ADC, and due to an existence of a residue transfer loop, $Y(Dout)=X(Din)+\partial q*(1-Z^{-1})$, the error will be multiplied by a high-pass transfer function, so a low-frequency noise will be shaped to a high frequency, and then the high-frequency noise will be filtered out by a digital filter to achieve an ultra-high precision.

It should be noted that the current rudder 30 controls current sources with different bit weights to generate current by inputting a digital signal sequence. The current rudder 30 is also connected with a digital controller and outputs a preset static working current according to requirements, for example, outputting a static working current in a range of 50 uA to 150 uA.

The DAC capacitor array comprises the first DAC capacitor array 21 and the second DAC capacitor array 22 constituting a differential structure, the sampling switch module includes a first switch unit 11 and a second switch unit 12 connected to the first DAC capacitor array 21 and the second DAC capacitor array 22 correspondingly, and inputting differential analog signals from external. The first switch unit 11 includes switches whose quantity is equal to the quantity of capacitors of the first DAC capacitor array 21, and the second switch unit 12 include switches whose quantity is equal to the quantity of capacitors of the second DAC capacitor array 22. The sampling switch module is also connected to a reference voltage, and conducts corresponding switches to sample under control of a logic controlling circuit 80.

The first DAC capacitor array 21 includes a first sub-capacitor array and a second sub-capacitor array arranged to form high and low segment bits. The second DAC capacitor array 22 includes a third sub-capacitor array and a fourth sub-capacitor array arranged to form high and low segment bits. A plurality of first capacitor units are sequentially arranged from low to high in a binary weighted manner according to capacitance. A plurality of second sub-capacitor arrays are sequentially arranged from high to low bits in the binary weighted manner. The first sub-capacitor array and the second sub-capacitor arrays are arranged in parallel. A plurality of third capacitor units are arranged sequentially from low to high in the binary weighted manner according to capacitance. A plurality of fourth sub-capacitor arrays are arranged sequentially from high to low in the binary weighted manner, and the third sub-capacitor array and the fourth sub-capacitor arrays are arranged in parallel.

The residue transfer module 40 includes a first PMOS transistor Q2, a second PMOS transistor Q3 and a first switch circuit Q1. An input terminal of the first switch circuit Q1 is the input terminal of the residue transfer module 40, a controlled terminal of the first switch circuit Q1 is the second controlled terminal of the residue transfer module 40, an output terminal of the first switch circuit Q1, a source of the first PMOS transistor Q2 and a source of the second PMOS transistor Q3 are interconnected. A drain of the first PMOS transistor Q2 and a drain of the second PMOS transistor Q3 constitute the output terminal of the residue transfer module 40, and a gate of the first PMOS transistor Q2 and a gate of the second PMOS transistor Q3 are the first controlled terminal of the residue transfer module 40.

The first switch circuit Q1 receives a control signal output from the logic controlling circuit 80 and turns on. The first PMOS transistor Q2 and the second PMOS transistor Q3 respectively receive the residue differential signal for bias. According to the working principle of the MOS tube, the greater the voltage across the MOS tube, the greater the output current of the MOS tube. The differential residue signal (which is the difference between Vop and Von) is biased by different MOS tubes and fixed pulse widths to output bias differential signals (Vrp and Vrn). It should be noted that the first switch circuit Q1 can adopt switches with on-off capability, such as MOS tubes, triodes, etc. No specific restriction is made here.

The residue holding capacitor module 60 includes a first residue holding capacitor C1 and a second residue holding capacitor C2 of equal capacitance. A first terminal of the first residue holding capacitor C1 is connected to the drain of the first PMOS transistor Q2, a first terminal of the second residue holding capacitor C2 is connected to the drain of the second PMOS transistor Q3, and a second terminal of the first residue holding capacitor C1 and a second residue holding capacitor C2 are both grounded.

A capacitance of the first DAC capacitor array 21 is four times larger than a capacitance of the first residue holding capacitor C1, and a capacitance of the second DAC capacitor array 22 is four times larger than a capacitance of the second residue holding capacitor C2.

At initial operation of the residue transfer loop, the logic controlling circuit 80 outputs a control signal to the reset switch module 50 to have the reset switch module 50 grounded, thereby zeroing charges on the residue holding capacitor. Then, after a last conversion of the analog-to-digital converter, when the differential residue signal (which is the difference between Vop and Von, i.e. error $\partial q*Z-1$) remains on the capacitor array, the differential residue signal is output to the residue transfer module 40, at the same time, the residue transfer module 40 receives an S1 signal with a fixed pulse width T, at this time, the PMOS transistor biased by the differential residue signal charges the residue holding capacitor module 60. After a time duration of T and the charging is completed, a voltage difference between Vrp and Vrn is gain*(Vop−Von), i.e. $Vrp-Vrn=\partial q*z-1*gain$. The gain is determined by the pulse width of the S1 signal, the bias circuit, process parameters and a size of the PMOS transistors. Therefore, the static working current of the current rudder 30 can be adjusted by a digital controller to fix a value of the gain.

After the charge of the residue capacitor module is completed, the sampling switch module controlled by the sampling signal controls the current sampling of the DAC capacitor array, and keeps the Vip-Vin differential analog signals on the CDAC capacitor array, the sharing signal turns on the charge sharing switch module 70 after the sampling is finished, and the residue holding capacitor module 60 and the DAC capacitor array share charges. After the sharing is finished, voltages of the DAC capacitor array and the residue holding capacitor module 60 become $4/5*(Vip-Vin)+1/5*\partial q*^{Z-1}*gain$, $4/5*(Vip-Vin)$ is defined as X, and the voltage of the DAC capacitor array is $X+1/5*\partial q*^{Z-1}*gain$, the value of the gain can be fixed to 5 by adjusting the static working current of the current rudder 30, then the voltage is $X+\partial q*^{Z-1}$. This time after the conversion of the analog-to-digital converter, $Y(Dout)+\partial q=X$ $(Din)+\partial q*^{Z-1}$ can be obtained, where $\partial q$ is a conversion error, this new residue is accumulated to a next conversion through the residue transfer loop. Since the residue of each conversion will be multiplied by a coefficient 1 and accumulated to a next conversion, the analog-to-digital converter will realize a function of a first-order sigma-delta modulator, and the conversion error will be shaped by a first-order noise to realize higher conversion accuracy.

In the technical solution of the present application, a sampling switch module, a logic controlling circuit 80, a residue holding capacitor module 60, a DAC capacitor array, a residue transfer module 40, a current rudder 30, a reset switch module 50 and a charge sharing switch module 70 are adopted to form a residue transfer loop. The DAC capacitor array includes a first DAC capacitor array 21 and a second DAC capacitor array 22 constituting a differential structure. The current rudder 30 is configured to output a static operating current. The logic controlling circuit 80 is configured to sequentially output control signals according to preset time intervals in a preset period, to control the reset switch module 50, the residue transfer module 40, the sampling switch module and the charge sharing switch module 70 to operate sequentially. Under control of the logic controlling circuit 80, charges of the residue holding capacitor module 60 is reset by the reset switch module 50, under control of the logic controlling circuit 80, the sampling switch module is started and inputs differential analog signals from external into the DAC capacitor array, so that the DAC capacitor array samples the differential analog signals from external, and outputs a differential residue signal. The residue transfer module 40 is configured to output the static working current from the current rudder 30 to the residue holding capacitor module 60 for charging based on the differential residue signal and the control of the logic controlling circuit 80 after receiving the differential residue signal from the DAC capacitor array. The charge sharing switch module 70 is configured to share charges between the residue holding capacitor module 60 and the DAC capacitor array under control of the logic controlling circuit 80 after the DAC capacitor array finishes sampling, and generates a new differential residue signal for a next residue transfer. Each transferred differential residue signal is the same and accumulated to the next conversion, thus realizing first-order noise shaping and achieving higher conversion accuracy.

Figure 6:
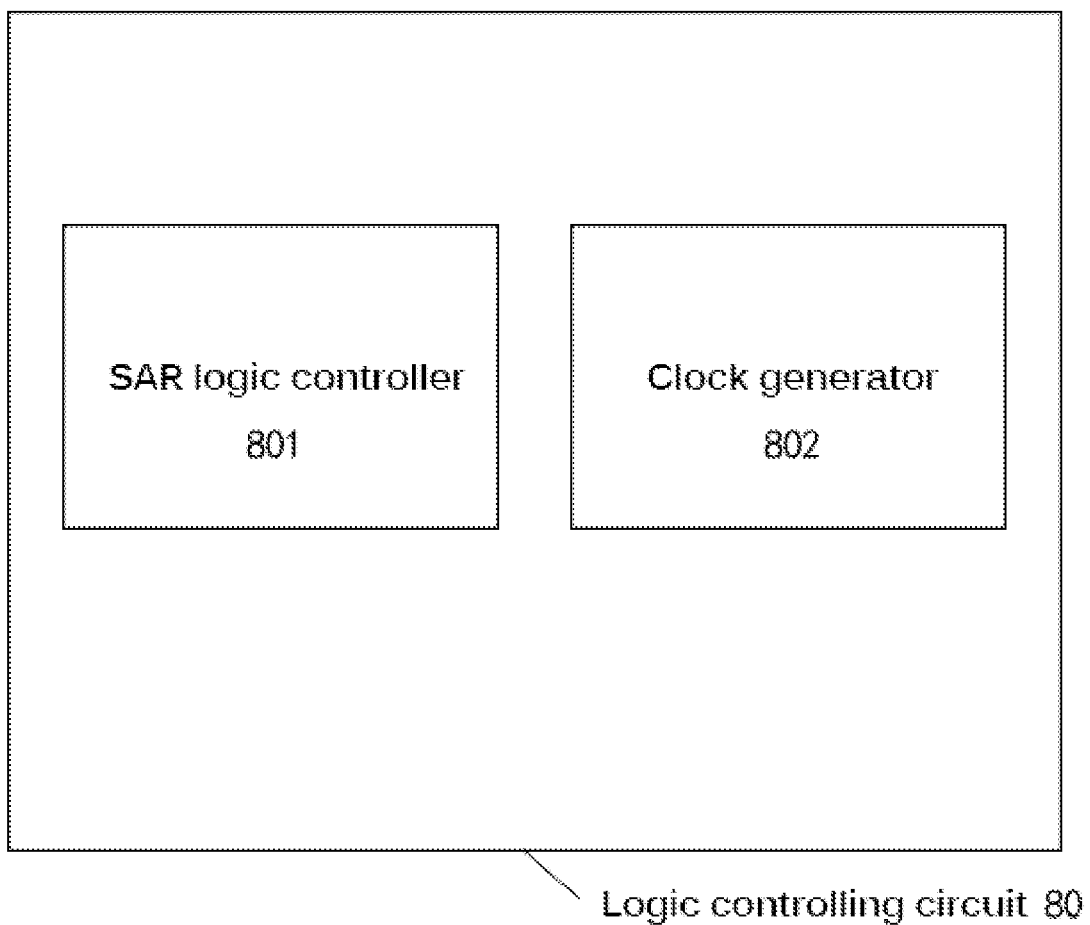
FIG. 6 is a schematic diagram of a logic controlling circuit.

In an alternative embodiment, according to FIG. 6, the logic controlling circuit 80 includes a SAR logic controller 801 and a clock generator 802.

A controlling terminal of the SAR logic controller is respectively connected with the controlled terminal of the sampling switch module, the second controlled terminal of the residue transfer module 40, the controlled terminal of the charge sharing switch module 70 and the controlled terminal of the reset switch module 50, and a signal terminal of the clock generator is connected with a signal terminal of the SAR logic controller.

The clock generator is configured to output pulse signals of fixed width to the SAR logic controller, so that the SAR logic controller controls the residue transfer module 40 to charge the residue holding capacitor for a first preset time.

The SAR logic controller is configured to output control signals to control the operation of the sampling switch module, the residue transfer module 40, the charge sharing switch module 70 and the reset switch module 50.

In this embodiment, the SAR logic controller outputs a reset signal to the reset switch module 50, outputs a sampling signal to the sampling switch module, outputs a charge sharing signal to the charge sharing switch module 70, receives the pulse signals of fixed width output by the clock generator and outputs the pulse signals of fixed width to the residue transfer module 40 after the reset signal is output, thus, charge reset, residue transfer, charging of the residue holding capacitor module 60, sampling, and charge sharing are sequentially realized.

In an optional embodiment, a capacitance of the first residue holding capacitor C1 is 32 times an equivalent capacitance of the lowest bit of the first DAC capacitor array 21.

A capacitance of the second residue holding capacitor C2 is 32 times an equivalent capacitance of the lowest bit of the second DAC capacitor array 22.

In this embodiment, the analog-to-digital converter is a SAR ADC with 12-bit resolution, including high 7 bits and low 5 bits. When the capacitance of the first residue holding capacitor C1 and the second residue holding capacitor C2 are both 1C, a value of the equivalent capacitance of the low 5 bits is 1/32 C.

The present application further provides a successive approximation register analog-to-digital converter, including a comparator 200, a register connected to an output terminal of the comparator 200 and a residue transfer loop as described above. As the successive approximation register analog-to-digital converter adopts all the technical solutions of all the above embodiments, it has at least all the technical effects brought by the technical solutions of the above embodiments and will not be repeated here.

In this embodiment, a general working process of the successive approximation register analog-to-digital converter is given as follows. First, the analog input signal is sampled and held and sent to one terminal of the comparator 200. Then, the logic controlling circuit 80 presets the highest bit of the register to 1, and clear all other bits. The analog-to-digital converter outputs half of a reference voltage to the other terminal of the comparator 200 under control of the reference voltage and the register. If a voltage of the analog input signal is greater than half of the reference voltage, the comparator 200 outputs 1 and the highest bit of the register is set to 1. Otherwise, if the voltage of the analog input signal is less than half of the reference voltage, the comparator 200 outputs 0 and the highest bit of the register is set to 0. In this way, the highest bit of the successive approximation register analog-to-digital converter is determined. Then, a second high order is determined, that is, the second high order of the register is preset to be 1, if the most significant bit determined in the previous conversion cycle is 1, then the analog-to-digital converter outputs three quarters of the reference voltage at this time, and the voltage of the analog input signal is compared with three quarters of the reference voltage to determine the second high order of the register. If the most significant bit determined in the previous conversion cycle is 0, then the analog-to-digital converter outputs a quarter of the reference voltage and the voltage of the analog input signal is compared with a quarter of the reference voltage to determine the second highest order of the register. And so on, until the lowest bit of the register is determined, so that the value of the register is the final output of the successive approximation register analog-to-digital converter.

Figure 5:
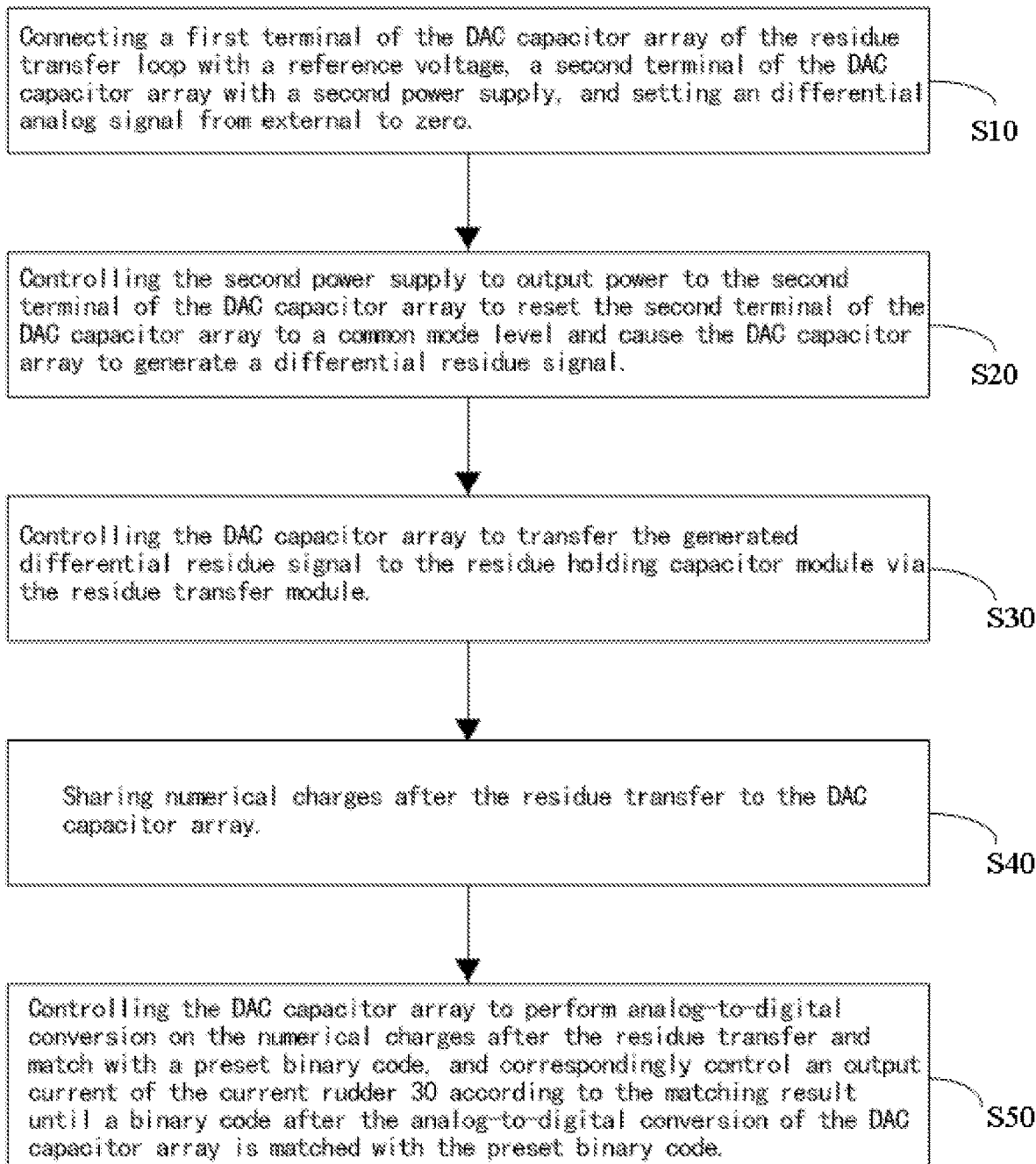
FIG. 5 is a schematic diagram of steps of a gain calibration method of the present application.

The present application also provides a gain calibration method to perform gain calibration on the residue transfer loop as described above, according to FIG. 5, the gain calibration method includes:

S10, connecting a first terminal of the DAC capacitor array of the residue transfer loop with a reference voltage, a second terminal of the DAC capacitor array with a second power supply, and setting an differential analog signal from external to zero;

S20, controlling the second power supply to output power to the second terminal of the DAC capacitor array to reset the second terminal of the DAC capacitor array to a common mode level and cause the DAC capacitor array to generate a differential residue signal;

S30, controlling the DAC capacitor array to transfer the generated differential residue signal to the residue holding capacitor module 60 via the residue transfer module 40;

S40, sharing numerical charges to the DAC capacitor array after the residue transfer;

S50, controlling the DAC capacitor array to perform analog-to-digital conversion on the numerical charges after the residue transfer and match a converted result with a preset binary code, and correspondingly control an output current of the current rudder 30 according to the matching result until a binary code after the analog-to-digital conversion of the DAC capacitor array is matched with the preset binary code.

In this embodiment, during calibration, the residue transfer loop does not receive differential analog signals from external, and a signal terminal of the sampling switch module receiving the differential analog signal is set to zero, the second terminal of the differential structure DAC capacitor array is simultaneously reset to a common mode level Vcm. That is, a voltage Vop of the second terminal of the first DAC capacitor array 21 and the voltage Von of the second terminal of the second DAC capacitor array 22 at this time are both Vcm, and switches connecting with the first terminals of all CDAC capacitors are connected to Vrefp (positive reference voltage). As for the residue holding capacitor module 60, the voltage of a first residue holding capacitor C1 remains constant, the switch connecting to the second residue holding capacitor C2 is switched to Vrefn (negative reference voltage). At this time, a voltage value of the first DAC capacitor array 21 is still Vcm, and a value of the voltage of the second terminal of the second DAC capacitor array 22 become Vcm-32LSB. This time, the residue transfer is performed, that is, a residue with a size of 32LSB is transferred to a next residue transfer and charge sharing, that is, the value of the next conversion is 0+32LSB*gain*1/5.

According to an output result of the analog-to-digital converter at this time, the output result of the analog-to-digital converter is compared with a preset binary code 000000100000. If the output result of the analog-to-digital converter is larger, it means that the gain is greater than 5. The output current of the current rudder 30 is reduced by adjusting the value of the digital controller, so as to reduce the gain of the residue transfer module 40. Such a process is cycled several times until the output result of the analog-to-digital converter is not greater than 000000100000. If the output result of the analog-to-digital converter is smaller, adjust the gain reversely. Finally, a residue transfer loop with an error within 1+−3% is obtained, thus achieving an accuracy of more than 16 bits.

The foregoing is only an optional embodiment of the present application, and is not intended to limit the scope of the present application. All equivalent structural changes made under the inventive concept of the present application, using the contents of the specification and drawings of the present application, or direct/indirect application in other related technical fields are included in the scope of patent protection of the present application.

The invention claimed is:

1. A residue transfer loop comprising a sampling switch module, a logic controlling circuit, a residue holding capacitor module, a digital-to-analog converter (DAC) capacitor array, a residue transfer module, a current rudder, a reset switch module and a charge sharing switch module; wherein, the DAC capacitor array comprises a first DAC capacitor array and a second DAC capacitor array constituting a differential structure;

a first terminal of the sampling switch module is configured to input differential analog signals, a second terminal of the sampling switch module is connected with a first terminal of the DAC capacitor array, a second terminal of the DAC capacitor array, a first terminal of the charge sharing switch module, a first controlled terminal of the residue transfer module and an input terminal of a comparator are connected, an input terminal of the residue transfer module is connected with a power output terminal of the current rudder, an output terminal of the residue transfer module is connected with a first terminal of the residue holding capacitor module, a second terminal of the charge sharing switch module and a first terminal of the reset switch module, a second terminal of the residue holding capacitor module and a second terminal of the reset switch module are grounded, and a controlled terminal of the sampling switch module, a second controlled terminal of the residue transfer module, a controlled terminal of the charge sharing switch module and a controlled terminal of the reset switch module are all connected with a controlling terminal of a logic controlling circuit;

the current rudder is configured to output a static working current;

the logic controlling circuit is configured to sequentially output control signals according to a preset time interval in a preset period to control the reset switch module, the residue transfer module, the sampling switch module and the charge sharing switch module to work sequentially;

the reset switch module is configured to reset charges of the residue holding capacitor module based on a control of the logic controlling circuit;

the sampling switch module is configured to start under control of the logic controlling circuit, input the differential analog signals from external to the DAC capacitor array, thereby the differential analog signals are sampled by the DAC capacitor array and differential residue signals are output;

the residue transfer module is configured to output the static working current from the current rudder to the residue holding capacitor module for charging based on the differential residue signals and a control of the logic controlling circuit after receiving the differential residue signals from the DAC capacitor array; and the charge sharing switch module is configured to share charges between the residue holding capacitor module and the DAC capacitor array under control of the logic controlling circuit after the DAC capacitor array finishes sampling, and generates the same differential residue signals for a next residue transfer.

2. The residue transfer loop of claim 1, wherein the residue transfer module comprises a first P-channel metal-oxide-semiconductor (PMOS) transistor, a second PMOS transistor, and a first switch circuit;

an input terminal of the first switch circuit is the input terminal of the residue transfer module, a controlled terminal of the first switch circuit is the second controlled terminal of the residue transfer module, an output terminal of the first switch circuit, a source of the first PMOS transistor and a source of the second PMOS transistor are interconnected, a drain of the first PMOS transistor and a drain of the second PMOS transistor are the output terminals of the residue transfer module, and a gate of the first PMOS transistor and a gate of the second PMOS transistor are the first controlled terminal of the residue transfer module.

3. The residue transfer loop of claim 2, wherein the residue holding capacitor module comprises a first residue holding capacitor and a second residue holding capacitor with equal capacitance, a first terminal of the first residue holding capacitor is connected to the drain of the first PMOS transistor, a first terminal of the second residue holding capacitor is connected to the drain of the second PMOS transistor, and a second terminal of the first residue holding capacitor and a second terminal of the second residue holding capacitor are both grounded.

4. The residue transfer loop of claim 2, wherein the logic controlling circuit comprises a successive approximation register (SAR) logic controller and a clock generator;

a controlling terminal of the SAR logic controller is respectively connected with the controlled terminal of the sampling switch module, the second controlled terminal of the residue transfer module, the controlled terminal of the charge sharing switch module and the controlled terminal of the reset switch module, and a signal terminal of the clock generator is connected with a signal terminal of the SAR logic controller;

the clock generator is configured to output pulse signals of fixed width to the SAR logic controller, thereby the residue transfer module is controlled by the SAR logic controller to charge the residue holding capacitor for a first preset time; and the SAR logic controller is configured to output a control signal to control the sampling switch module, the residue transfer module, the charge sharing switch module and the reset switch module to work.

5. The residue transfer loop of claim 3, wherein a first terminal of the first DAC capacitor array is connected to a positive input terminal of the differential analog signals through a switch unit corresponding to the sampling switch module, and a second terminal of the first DAC capacitor array is a positive output terminal of the differential residue signals of the DAC capacitor array;

a first terminal of the second DAC capacitor array is connected with a negative input terminal of the differential analog signals through a switch unit corresponding to the sampling switch module, and a second terminal of the second DAC capacitor array is a negative output terminal of the differential residue signals of the DAC capacitor array.

6. The residue transfer loop of claim 5, wherein the first DAC capacitor array has a capacitance four times as capacitance of the first residue holding capacitor and the second DAC capacitor array has a capacitance four times as capacitance of the second residue holding capacitor.

7. The residue transfer loop of claim 6, wherein the first residue holding capacitor has a capacitance that is 32 times as an equivalent capacitance of a lowest bit of the first DAC capacitor array;

a capacitance of the second residue holding capacitor is 32 times as an equivalent capacitance of a lowest bit of the second DAC capacitor array.

8. The residue transfer loop of claim 7, wherein the current rudder is further connected to a digital controller configured to control the current rudder to output a varying static operating current to maintain a constant gain of the residue transfer module.

9. A successive approximation register analog-to-digital converter comprising a comparator, a register connected to an output terminal of the comparator and a residue transfer loop, wherein the residue transfer loop comprises a sampling switch module, a logic controlling circuit, a residue holding capacitor module, a DAC capacitor array, a residue transfer module, a current rudder, a reset switch module and a charge sharing switch module; the DAC capacitor array comprises a first DAC capacitor array and a second DAC capacitor array constituting a differential structure;

a first terminal of the sampling switch module is configured to input differential analog signals, a second terminal of the sampling switch module is connected with a first terminal of the DAC capacitor array, a second terminal of the DAC capacitor array, a first terminal of the charge sharing switch module, a first controlled terminal of the residue transfer module and an input terminal of the comparator are connected, an input terminal of the residue transfer module is connected with a power output terminal of the current rudder, an output terminal of the residue transfer module is connected with a first terminal of the residue holding capacitor module, a second terminal of the charge sharing switch module and a first terminal of the reset switch module, a second terminal of the residue holding capacitor module and a second terminal of the reset switch module are grounded, and a controlled terminal of the sampling switch module, a second controlled terminal of the residue transfer module, a controlled terminal of the charge sharing switch module and a controlled terminal of the reset switch module are all connected with a controlling terminal of the logic controlling circuit;

the current rudder is configured to output a static working current;

the logic controlling circuit is configured to sequentially output control signals according to a preset time interval in a preset period to control the reset switch module, the residue transfer module, the sampling switch module and the charge sharing switch module to work sequentially;

the reset switch module is configured to reset charges of the residue holding capacitor module under control of the logic controlling circuit;

the sampling switch module is configured to start under control of the logic controlling circuit, input the differential analog signals from external to the DAC capacitor array, thereby the differential analog signals are sampled by the DAC capacitor array and differential residue signals are output;

the residue transfer module is configured to output the static working current from the current rudder to the residue holding capacitor module for charging based on the differential residue signals and a control of the logic controlling circuit after receiving the differential residue signals from the DAC capacitor array; and the charge sharing switch module is configured to share charges between the residue holding capacitor module and the DAC capacitor array under control of the logic controlling circuit after the DAC capacitor array finishes sampling, and generates the same differential residue signals for a next residue transfer.

10. The successive approximation register analog-to-digital converter of claim 9, wherein the residue transfer module comprises a first PMOS transistor, a second PMOS transistor, and a first switch circuit;

an input terminal of the first switch circuit is the input terminal of the residue transfer module, a controlled terminal of the first switch circuit is the second controlled terminal of the residue transfer module, an output terminal of the first switch circuit, a source of the first PMOS transistor and a source of the second PMOS transistor are interconnected, a drain of the first PMOS transistor and a drain of the second PMOS transistor are the output terminals of the residue transfer module, and a gate of the first PMOS transistor and a gate of the second PMOS transistor are the first controlled terminal of the residue transfer module.

11. The successive approximation register analog-to-digital converter of claim 10, wherein the residue holding capacitor module comprises a first residue holding capacitor and a second residue holding capacitor with equal capacitance, a first terminal of the first residue holding capacitor is connected to the drain of the first PMOS transistor, a first terminal of the second residue holding capacitor is connected to the drain of the second PMOS transistor, and a second terminal of the first residue holding capacitor and a second terminal of the second residue holding capacitor are both grounded.

12. The successive approximation register analog-to-digital converter of claim 10, wherein the logic controlling circuit comprises a SAR logic controller and a clock generator;

a controlling terminal of the SAR logic controller is respectively connected with the controlled terminal of the sampling switch module, the second controlled terminal of the residue transfer module, the controlled terminal of the charge sharing switch module and the controlled terminal of the reset switch module, and a signal terminal of the clock generator is connected with a signal terminal of the SAR logic controller;

the clock generator is configured to output pulse signals of fixed width to the SAR logic controller, thereby the residue transfer module is controlled by the SAR logic controller to charge the residue holding capacitor for a first preset time; and the SAR logic controller is configured to output a control signal to control the sampling switch module, the residue transfer module, the charge sharing switch module and the reset switch module to work.

13. The successive approximation register analog-to-digital converter of claim 11, wherein a first terminal of the first DAC capacitor array is connected to a positive input terminal of the differential analog signals through a switching unit corresponding to the sampling switch module, and a second terminal of the first DAC capacitor array is a positive output terminal of the differential residue signals of the DAC capacitor array;

a first terminal of the second DAC capacitor array is connected with a negative input terminal of the differential analog signals through a switch unit corresponding to the sampling switch module, and a second terminal of the second DAC capacitor array is a negative output terminal of the differential residue signals of the DAC capacitor array.

14. The successive approximation register analog-to-digital converter of claim 13, wherein the first DAC capacitor array has a capacitance four times as a capacitance value of the first residue holding capacitor and the second DAC capacitor array has a capacitance four times as a capacitance value of the second residue holding capacitor.

15. The successive approximation register analog-to-digital converter of claim 14, wherein the first residue holding capacitor has a capacitance that is 32 times as an equivalent capacitance of the lowest bit of the first DAC capacitor array;

the capacitance of the second residue holding capacitor is 32 times as an equivalent capacitance of the lowest bit of the second DAC capacitor array.

16. The successive approximation register analog-to-digital converter of claim 15, wherein the current rudder is further connected to a digital controller configured to control the current rudder to output a varying quiescent operating current to maintain a constant gain of the residue transfer module.

17. A gain calibration method configured to perform gain calibration on a residue transfer loop of claim 1, wherein the gain calibration method comprises:

connecting the first terminal of the DAC capacitor array of the residue transfer loop with a reference voltage, the second terminal of the DAC capacitor array with a second power supply, and setting the differential analog signals from external to zero;

controlling the second power supply to output power to the second terminal of the DAC capacitor array to reset the second terminal of the DAC capacitor array to a common mode level and cause the DAC capacitor array to generate the differential residue signals;

controlling the DAC capacitor array to transfer the generated differential residue signals to the residue holding capacitor module via the residue transfer module;

sharing numerical charges to the DAC capacitor array after the residue transfer;

controlling the DAC capacitor array to perform analog-to-digital conversion on the numerical charges after the residue transfer and match a converted result with a preset binary code, and correspondingly control an output current of the current rudder according to a matching result until a binary code after the analog-to-digital conversion of the DAC capacitor array is matched with the preset binary code.

* * * * *